(12) United States Patent
Barns et al.

(10) Patent No.: US 7,422,936 B2
(45) Date of Patent: Sep. 9, 2008

(54) FACILITATING REMOVAL OF SACRIFICIAL LAYERS VIA IMPLANTATION TO FORM REPLACEMENT METAL GATES

(75) Inventors: Chris E. Barns, Portland, OR (US); Matt Prince, Portland, OR (US); Mark L. Doczy, Beaverton, OR (US); Justin K. Brask, Portland, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 10/925,517

(22) Filed: Aug. 25, 2004

(65) Prior Publication Data

US 2006/0046448 A1    Mar. 2, 2006

(51) Int. Cl.
*H01L 21/338* (2006.01)
(52) U.S. Cl. .................. 438/183; 438/303; 438/520; 438/528; 438/705; 438/724; 438/744; 438/757
(58) Field of Classification Search .................. None
See application file for complete search history.

(56) References Cited

U.S. PATENT DOCUMENTS

| 5,391,510 | A | * | 2/1995 | Hsu et al. | 438/301 |
| 5,856,225 | A | * | 1/1999 | Lee et al. | 438/291 |
| 6,368,947 | B1 | * | 4/2002 | Yu | 438/530 |
| 6,607,950 | B2 | * | 8/2003 | Henson et al. | 438/197 |

* cited by examiner

*Primary Examiner*—Zandra Smith
*Assistant Examiner*—Khanh B Duong
(74) *Attorney, Agent, or Firm*—Trop, Pruner & Hu, P.C.

(57) ABSTRACT

Replacement metal gates may be formed by removing a polysilicon layer from a gate structure. The gate structure may be formed by patterning the polysilicon layer and depositing a spacer layer over the gate structure such that the spacer layer has a first polish rate. The spacer layer is then etched to form a sidewall spacer. An interlayer dielectric is applied over the gate structure with the sidewall spacer. The interlayer dielectric has a second polish rate higher than the first polish rate. A hard mask may also be applied over the gate structure and implanted so that the hard mask may be more readily removed.

15 Claims, 5 Drawing Sheets

US 7,422,936 B2

FACILITATING REMOVAL OF SACRIFICIAL LAYERS VIA IMPLANTATION TO FORM REPLACEMENT METAL GATES

BACKGROUND

This application claims priority from JP 2003-336137 filed on Sep. 26, 2003, which is hereby incorporated by reference in its entirety.

The present invention relates to methods for making semiconductor devices, in particular, semiconductor devices with metal gate electrodes.

MOS field-effect transistors with very thin gate dielectrics made from silicon dioxide may experience unacceptable gate leakage currents. Forming the gate dielectric from certain high dielectric constant (K) dielectric materials, instead of silicon dioxide, can reduce gate leakage. As used herein, high-k dielectric means having a dielectric constant higher than 10. When, however, a high-k dielectric film is initially formed, it may have a slightly imperfect molecular structure. To repair such a film, it may be necessary to anneal it at a relatively high temperature.

Because such a high-k dielectric layer may not be compatible with polysilicon, it may be desirable to use metal gate electrodes in devices that include high-k gate dielectrics. When making a CMOS device that includes metal gate electrodes, it may be necessary to make the NMOS and PMOS gate electrodes from different materials. A replacement gate process may be used to form gate electrodes from different metals. In that process, a first polysilicon layer, bracketed by a pair of spacers, is removed selectively to a second polysilicon layer to create a trench between the spacers. The trench is filled with a first metal. The second polysilicon layer is then removed, and replaced with a second metal that differs from the first metal.

The use of polysilicon layers that are ultimately replaced by the replacement metal gate raises a problem. When the source and drains are implanted using the polysilicon layers as a mask, and those implanted regions are subsequently annealed, a silicide forms over the polysilicon. Since it is intended to replace this polysilicon, the polysilicon must be etched away. But the silicide acts as a block, preventing removal of the polysilicon underlying the silicide.

Thus, there is a need for alternate ways to form replacement metal gate electrodes.

Features shown in these figures are not intended to be drawn to scale.

DETAILED DESCRIPTION

Figure 1A:
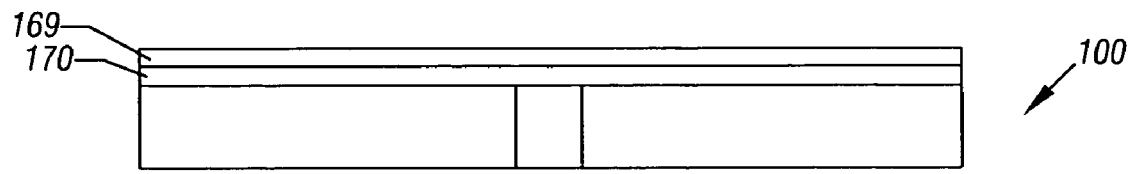
FIGS. 1A-1N represent cross-sections of structures that may be formed when carrying out an embodiment of the method of the present invention.
Figure 1B:
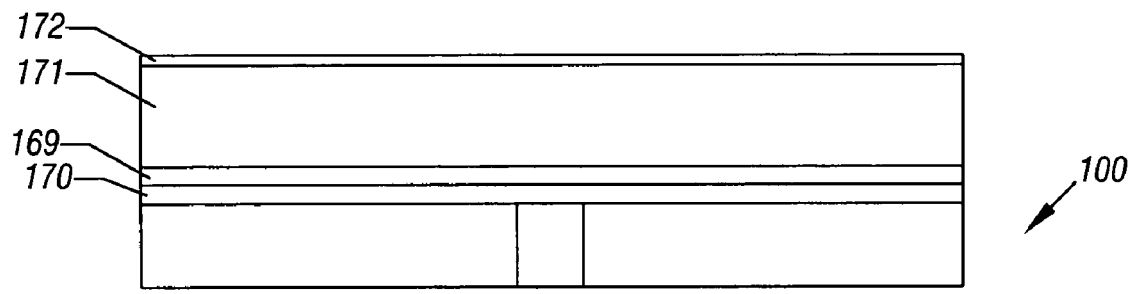
Figure 1C:
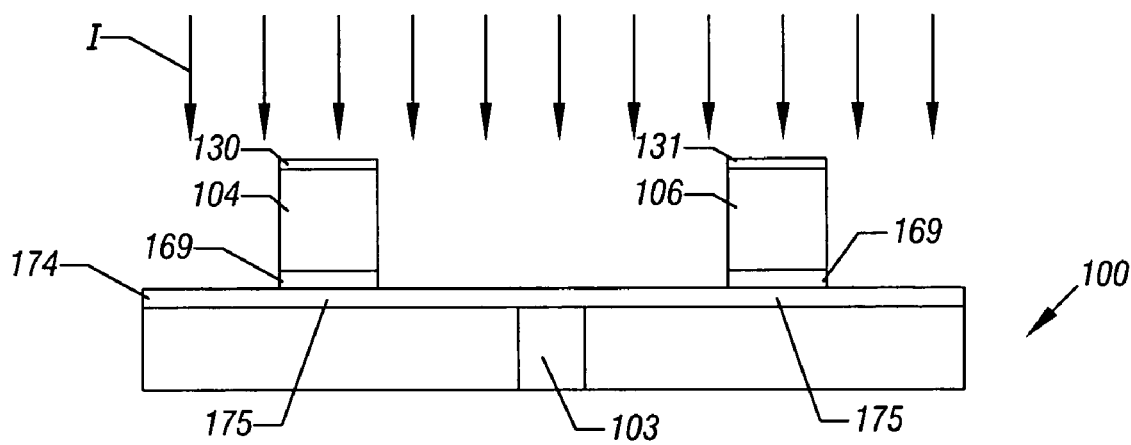
Figure 1D:
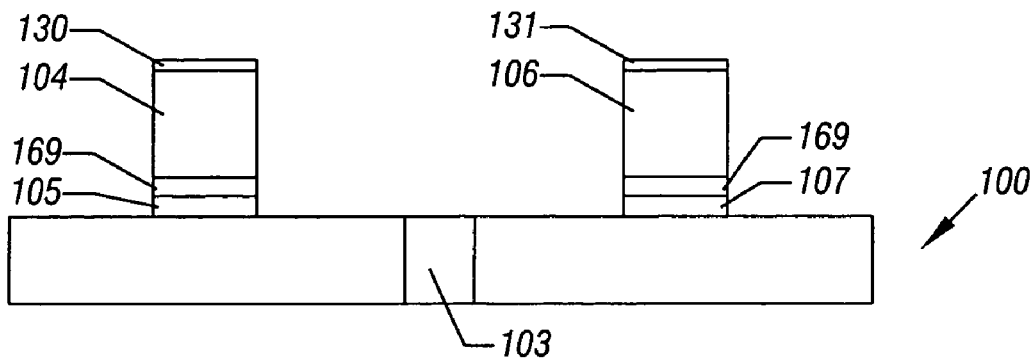
Figure 1E:
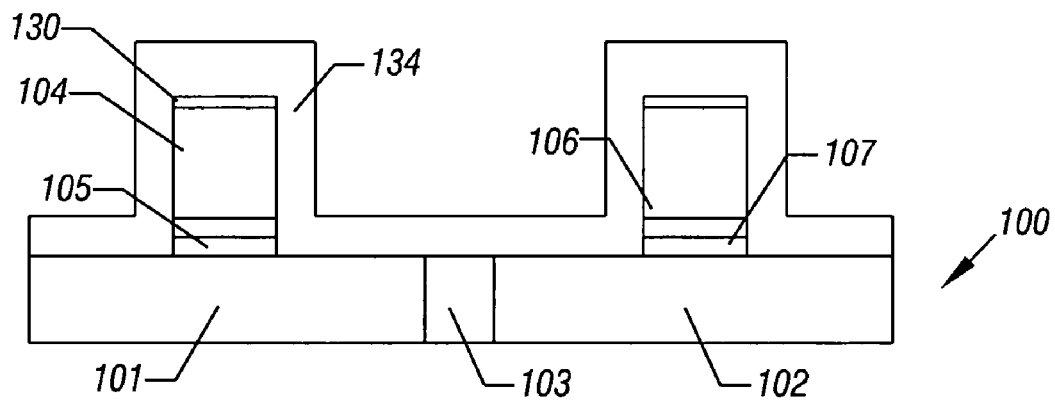
Figure 1F:
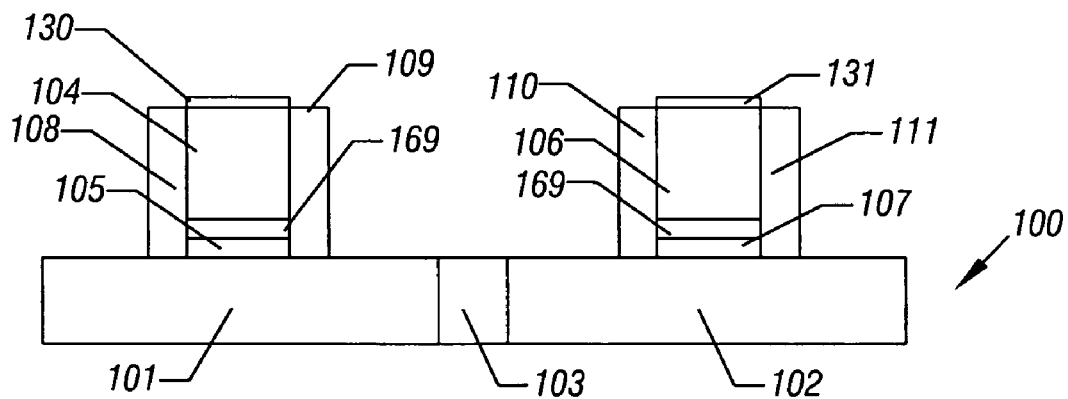
Figure 1G:
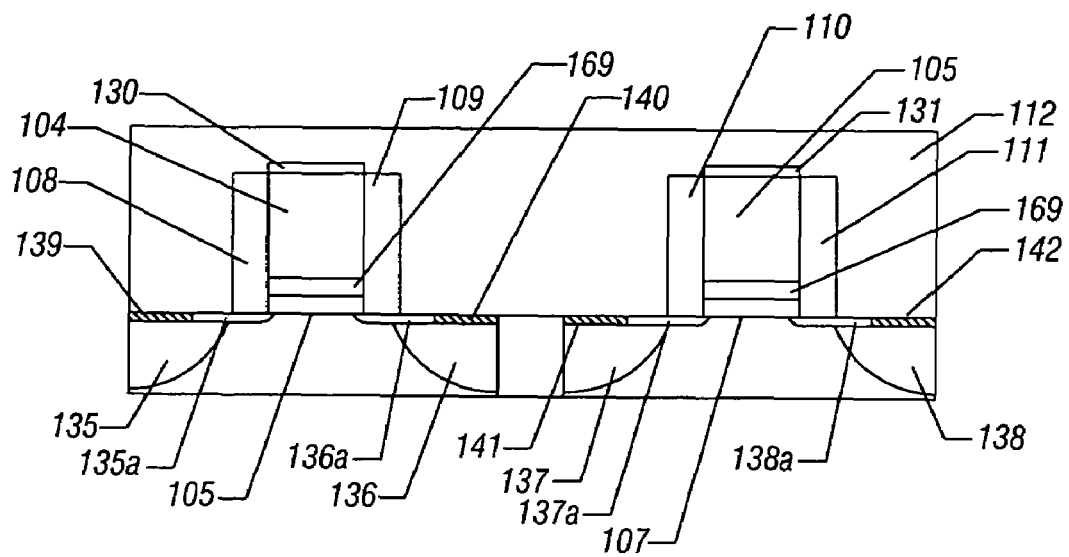
Figure 1H:
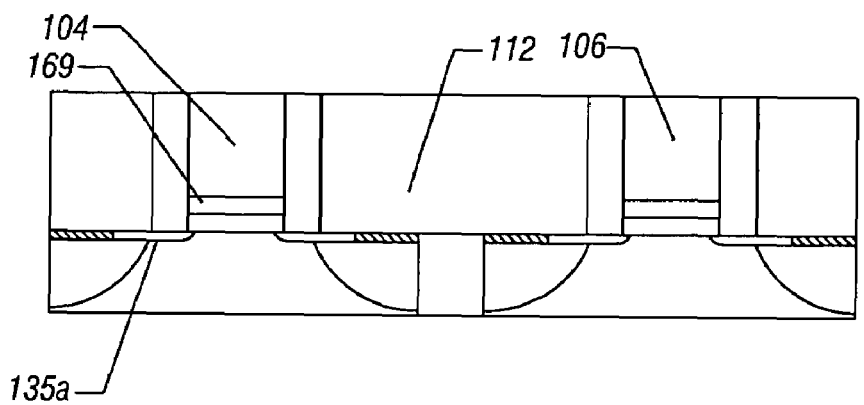
Figure 1I:
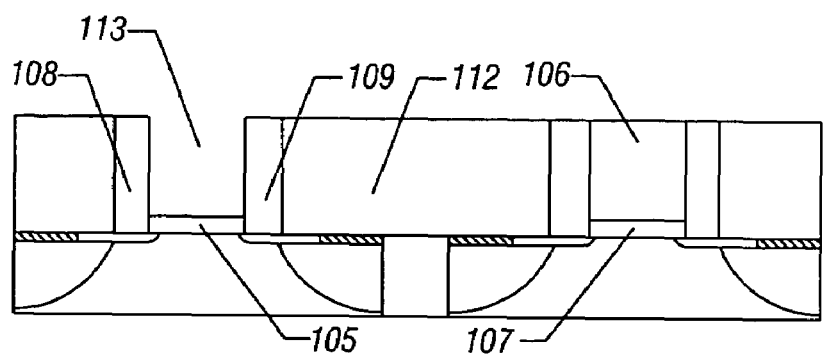
Figure 1J:
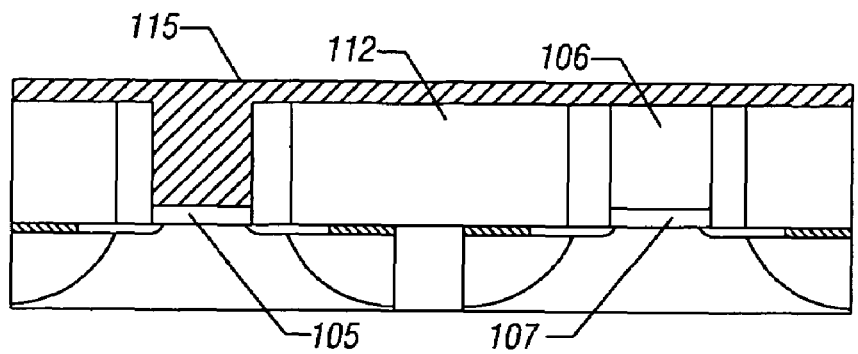
Figure 1K:
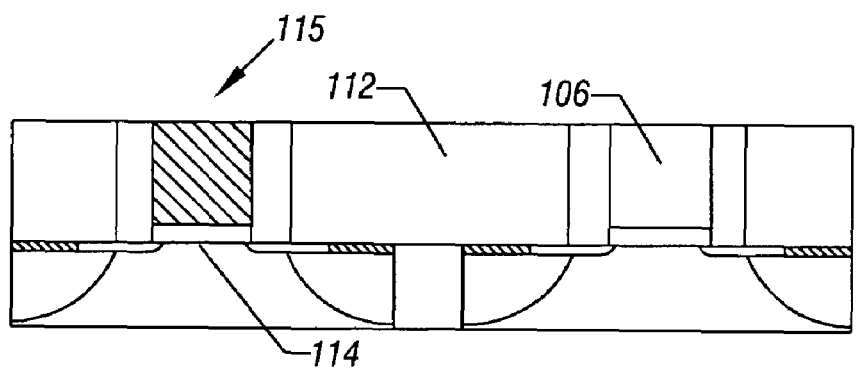
Figure 1L:
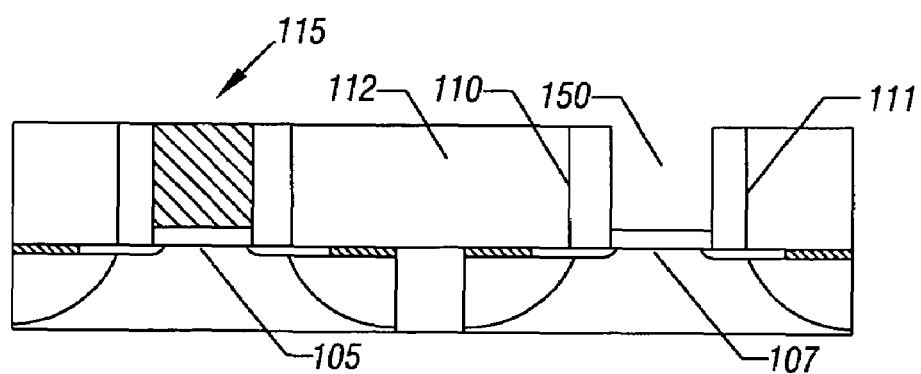
Figure 1M:
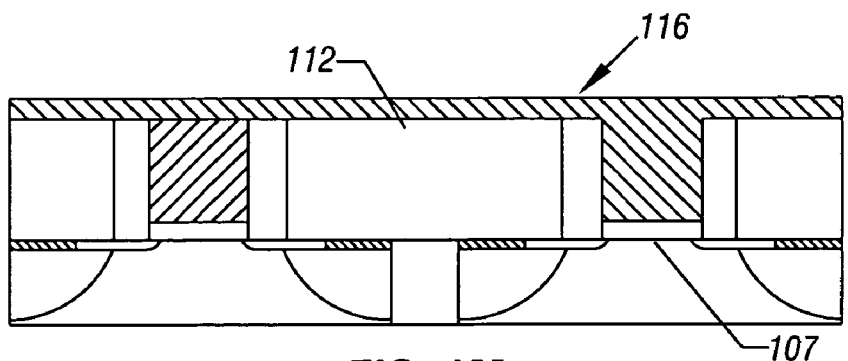
Figure 1N:
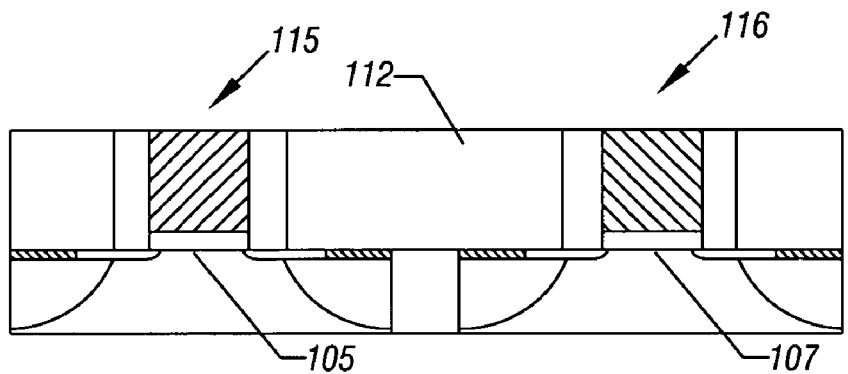

FIGS. 1A-1N illustrate structures that may be formed, when carrying out an embodiment of the method of the present invention. Initially, high-k gate dielectric layer 170 and a sacrificial metal layer 169 are formed on substrate 100, generating the FIG. 1A structure. Alternatively, although not shown, a dummy gate dielectric (e.g. a 20-30 Å SiO2 layer) may be carried through this portion of the flow and replaced by a high K dielectric at the time of the replacement gate process. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Some of the materials that may be used to make high-k gate dielectric layer 170 include: hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide and aluminum oxide. Although a few examples of materials that may be used to form high-k gate dielectric layer 170 are described here, that layer may be made from other materials that serve to reduce gate leakage. The layer 170 has a dielectric constant higher than 10 and from 15 to 25 in one embodiment of the present invention.

High-k gate dielectric layer 170 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 170. The CVD reactor should be operated long enough to form a layer with the desired thickness. In most applications, high-k gate dielectric layer 170 may be less than about 60 Angstroms thick, for example, and, in one embodiment, between about 5 Angstroms and about 40 Angstroms thick.

A sacrificial metal layer 169 may be formed over the dielectric layer 170. The sacrificial metal layer 169 may be any metal that is capable of withstanding high temperatures (greater than 450° C.) without reaction with overlying materials. As one example, the sacrificial metal layer 14 may be formed of titanium nitride. In one embodiment, the layer 169 may be formed by sputtering. In another embodiment, the layer 169 may be formed by atomic layer deposition.

After high-k gate dielectric layer 170 and sacrificial metal layer 169 are formed on substrate 100, sacrificial layer 171 is formed on high-k gate dielectric layer 170 as shown in FIG. 1B. In this embodiment, hard mask layer 172 is then formed on sacrificial layer 171, generating the FIG. 1B structure. Sacrificial layer 171 may comprise polysilicon, silicon germanium, silicon nitride, or germanium and may be deposited on sacrificial metal layer 169 using a conventional deposition process. Sacrificial layer 171 may be, for example, between about 100 and about 2,000 Angstroms thick, and, in one embodiment, between about 500 and about 1,600 Angstroms thick. The sacrificial layer 171 may also be made up of two stacked layers with a germanium containing layer on top and a silicon containing layer below, or vice versa.

Hard mask layer 172 may comprise silicon nitride between about 100 and about 1000 Angstroms thick, for example, and between about 200 and about 350 Angstroms thick in one embodiment. Hard mask layer 172 may be formed on sacrificial layer 171.

Sacrificial layer 171 and hard mask layer 172 are then patterned to form patterned hard mask layers 130, 131, and patterned sacrificial layers 104, 106, and 169—as FIG. 1C illustrates. Conventional wet or dry etch processes may be used to remove unprotected parts of hard mask layer 172, sacrificial metal layer 169 and sacrificial layer 171. In this embodiment, after those layers have been etched, exposed part 174 of high-k gate dielectric layer 170 is removed.

The patterned hard mask layers 130, 131 may be subjected to an implantation I to increase their polish rate. The implant may damage the hard mask sufficiently so that it polishes at a higher rate. In one embodiment, germanium may be implanted at a dose of $1 \times 10^{17} - 1 \times 10^{20}$ atoms per square centimeter and an energy of 0.5 to 5 keV.

Although exposed part 174 of high-k gate dielectric layer 170 may be removed using dry or wet etch techniques, it may be difficult to etch that layer using such processes without adversely affecting adjacent structures. It may be difficult to etch high-k gate dielectric layer 170 selectively to the underlying substrate using a dry etch process, and wet etch techniques may etch high-k gate dielectric layer 170 isotropically—undercutting overlying sacrificial layers 104, 106 in an undesirable fashion.

To reduce the lateral removal of high-k gate dielectric layer 170, as exposed part 174 of that layer is etched, exposed part 174 of high-k gate dielectric layer 170 may be modified to facilitate its removal selectively to covered part 175 of that layer. Exposed part 174 may be modified by adding impurities to that part of high-k gate dielectric layer 170 after sacrificial layer 171 has been etched. A plasma enhanced chemical vapor deposition ("PECVD") process may be used to add impurities to exposed part 174 of high-k gate dielectric layer 170. In such a PECVD process, a halogen or halide gas (or a combination of such gases) may be fed into a reactor prior to striking a plasma. The reactor should be operated under the appropriate conditions (e.g., temperature, pressure, radio frequency, and power) for a sufficient time to modify exposed part 174 to ensure that it may be removed selectively to other materials. In one embodiment, a low power PECVD process, e.g., one taking place at less than about 200 Watts, is used.

In one embodiment, hydrogen bromide ("HBr") and chlorine ("$Cl_2$") gases are fed into the reactor at appropriate flow rates to ensure that a plasma generated from those gases will modify exposed part 174 in the desired manner. Between about 50 and about 100 Watts wafer bias (for example, about 100 Watts) may be applied for a sufficient time to complete the desired transformation of exposed part 174. Plasma exposure lasting less than about one minute, and perhaps as short as 5 seconds, may be adequate to cause that conversion.

After exposed part 174 has been modified, it may be removed. The presence of the added impurities enables that exposed part to be etched selectively to covered part 175 to generate the FIG. 1D structure. In one embodiment, exposed part 174 is removed by exposing it to a relatively strong acid, e.g., a halide based acid (such as hydrobromic or hydrochloric acid) or phosphoric acid. When a halide based acid is used, the acid preferably contains between about 0.5% and about 10% HBr or HCl by volume—and more preferably about 5% by volume. An etch process that uses such an acid may take place at or near room temperature, and last for between about 5 and about 30 minutes—although a longer exposure may be used if desired. When phosphoric acid is used, the acid may contain between about 75% and about 95% $H_3PO_4$ by volume. An etch process that uses such an acid may, for example, take place at between about 140° C. and about 180° C., and, in one embodiment, at about 160° C. When such an acid is used, the exposure step may last between about 30 seconds and about 5 minutes—and for about one minute for a 20 Angstrom thick film.

FIG. 1D represents an intermediate structure that may be formed when making a complementary metal oxide semiconductor ("CMOS"). That structure includes first part 101 and second part 102 of substrate 100 shown in FIG. 1E. Isolation region 103 separates first part 101 from second part 102. Isolation region 103 may comprise silicon dioxide, or other materials that may separate the transistor's active regions. First sacrificial layer 104 is formed on first high-k gate dielectric layer 105, and second sacrificial layer 106 is formed on second high-k gate dielectric layer 107. Hard masks 130, 131 are formed on sacrificial layers 104, 106.

After forming the FIG. 1D structure, spacers may be formed on opposite sides of sacrificial layers 104, 106. When those spacers comprise silicon nitride, they may be formed in the following way. First, a silicon nitride layer of substantially uniform thickness, for example, less than about 1000 Angstroms thick—is deposited over the entire structure, producing the structure shown in FIG. 1E. Conventional deposition processes may be used to generate that structure.

In one embodiment, spacer layer 134 is deposited directly on substrate 100 and opposite sides of sacrificial layers 104, 106—without first forming a buffer oxide layer on substrate 100 and layers 104, 106. In alternative embodiments, however, such a buffer oxide layer may be formed prior to forming layer 134. Similarly, although not shown in FIG. 1E, a second oxide may be formed on layer 134 prior to etching that layer.

The spacer layer 134 may be formed of a material that has a polish rate substantially lower than that of the dielectric layer 112 (FIG. 1G). For example, the spacer layer 134 may be formed of silicon nitride or carbon doped silicon nitride when the layer 112 is formed of oxide. When nitride is used as the dielectric layer 112, carbon-doped silicon nitride may be used for the spacer layer 134 in one embodiment. The spacer layer 134 may be etched using a conventional process for anisotropically etching silicon nitride to create the FIG. 1F structure. As a result of that etch step, sacrificial layer 104 is bracketed by a pair of sidewall spacers 108, 109, and sacrificial layer 106 is bracketed by a pair of sidewall spacers 110, 111. The spacers 108-111 may have a height substantially equal to the height of the layers 104, 106.

As is typically done, it may be desirable to perform multiple masking and ion implantation steps (FIG. 1G) to create lightly implanted regions 135a-138a near layers 104, 106 (that will ultimately serve as tip regions for the device's source and drain regions), prior to forming spacers 108, 109, 110, 111 on sacrificial layers 104, 106. Also as is typically done, the source and drain regions 135-138 may be formed, after forming spacers 108, 109, 110, 111, by implanting ions into parts 101 and 102 of substrate 100, followed by applying an appropriate anneal step.

An ion implantation and anneal sequence used to form n-type source and drain regions within part 101 of substrate 100 may dope sacrificial layer 104 n-type at the same time. Similarly, an ion implantation and anneal sequence used to form p-type source and drain regions within part 102 of substrate 100 may dope sacrificial layer 106 p-type. When doping sacrificial layer 106 with boron, that layer should include that element at a sufficient concentration to ensure that a subsequent wet etch process, for removing n-type sacrificial layer 104, will not remove a significant amount of p-type sacrificial layer 106.

The anneal will activate the dopants that were previously introduced into the source and drain regions and tip regions and into sacrificial layers 104, 106. In a preferred embodiment, a rapid thermal anneal is applied that takes place at a temperature that exceeds about 1,000° C.—and, optimally, that takes place at 1,080° C. In addition to activating the dopants, such an anneal may modify the molecular structure of high-k gate dielectric layers 105, 107 to create gate dielectric layers that may demonstrate improved performance.

Because of the imposition of the sacrificial metal layer 169, better performing dielectric layers 170 may result from these high temperature steps without significant reaction between the high dielectric constant dielectric layer 170 and the sacrificial layer 171.

After forming spacers 108, 109, 110, 111, dielectric layer 112 may be deposited over the device, generating the FIG. 1G structure. Dielectric layer 112 may comprise silicon dioxide, silicon nitride, or a low-k material. The dielectric layer 112 may be chosen to have a low etch rate in the material used for the opening of the layers 104, 106. For example, when hydrofluoric acid (HF) chemistry is used following a polish step but before the sacrificial layers 104 and 106 are removed, nitride may be used as the layer 112. Dielectric layer 112 may be doped with phosphorus, boron, or other elements, and may be formed using a high density plasma deposition process. By this stage of the process, source and drain regions 135, 136, 137, 138, which are capped by silicided regions 139, 140, 141, 142, have already been formed. Those source and drain regions may be formed by implanting ions into the substrate, then activating them. Alternatively, an epitaxial growth process may be used to form the source and drain regions, as will be apparent to those skilled in the art.

Commonly used spacer, source/drain, and silicide formation techniques can be used to make the FIG. 1G structure. That structure may include other features—not shown, so as not to obscure the method of the present invention—that may be formed using conventional process steps.

Dielectric layer 112 is removed from hard masks 130, 131, which are, in turn, removed from patterned sacrificial layers 104, 106, producing the FIG. 1H structure. A conventional chemical mechanical polishing ("CMP") operation may be applied to remove that part of dielectric layer 112 and hard masks 130, 131. Hard masks 130, 131 may be removed to expose patterned sacrificial layers 104, 106. Hard masks 130, 131 may be polished or removed by a selective wet etch from the surface of layers 104, 106, when dielectric layer 112 is polished—as they will have served their purpose by that stage in the process.

Because the spacer layer 134 is formed of a material that has a polish rate substantially lower than that of the dielectric layer 112, the polish or planarization stops on top of the spacers 108-111. Thus, the spacers 108-111 act as polish stops for the planarization process. The use of the spacers as a polish stop may maintain a more constant layer 112 thickness when the sacrificial layers 104, 106 are exposed, and may reduce excess dielectric layer 112 losses. The hard marks layers 130, 131 may be more readily polished off because of the implantation I. When the layer 112 is nitride or another material that has a low etch rate in the material used in the opening polish, erosion of the layer 112 may be reduced.

After forming the FIG. 1H structure, sacrificial layer 104 is removed to generate trench 113 that is positioned between sidewall spacers 108, 109—producing the structure shown in FIG. 1I.

In one embodiment, a wet etch process that is selective for layers 104 over sacrificial layer 106 is applied to remove layers 104 and 169 without removing significant portions of layer 106.

When sacrificial layer 104 is n-type polysilicon, and sacrificial layer 106 is p-type polysilicon (e.g., boron-doped), such a wet etch process may comprise exposing sacrificial layer 104 to an aqueous solution that comprises a source of hydroxide for a sufficient time at a sufficient temperature to remove substantially all of layer 104. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

Any remaining sacrificial layer 104 may be selectively removed by exposing it to a solution, which is maintained at a temperature between about 15° C. and about 90° C. (for example, below about 40° C.), that comprises between about 2 and about 30 percent ammonium hydroxide by volume in deionized water. During that exposure step, which preferably lasts at least one minute, it may be desirable to apply sonic energy at a frequency of between about 10 kHz and about 2,000 kHz, while dissipating at between about 1 and about 10 Watts/cm$^2$.

In one embodiment, sacrificial layer 104, with a thickness of about 800 Angstroms, may be selectively removed by exposing it at about 25° C. for about 30 minutes to a solution that comprises about 15 percent ammonium hydroxide by volume in deionized water, while applying sonic energy at about 1,000 kHz—dissipating at about 5 Watts/cm$^2$. Such an etch process should remove substantially all of an n-type sacrificial layer without removing a meaningful amount of a p-type sacrificial layer.

As an alternative, sacrificial layer 104 may be selectively removed by exposing it for at least one minute to a solution, which is maintained at a temperature between about 60° C. and about 90° C., that comprises between about 20 and about 30 percent TMAH by volume in deionized water, while applying sonic energy. Removing sacrificial layer 104, with a thickness of about 800 Angstroms, by exposing it at about 80° C. for about 2 minutes to a solution that comprises about 25 percent TMAH by volume in deionized water, while applying sonic energy at about 1,000 kHz—dissipating at about 5 Watts/cm$^2$—may remove substantially all of layer 104 without removing a significant amount of layer 106. First high-k gate dielectric layer 105, or sacrificial silicon oxide in another embodiment, should be sufficiently thick to prevent the etchant that is applied to remove sacrificial layer 104 from reaching the channel region that is located beneath first high-k gate dielectric layer 105.

The sacrificial metal layer 169 may also be removed by selective etching. In some embodiments, the layer 169 may not be removed. In some embodiments, the dielectric layer 105 may be removed before forming the replacement metal gate. In such case, a metal oxide gate dielectric may be formed before forming the replacement gate.

In the illustrated embodiment, n-type metal layer 115 is formed directly on layer 105 to fill trench 113 and to generate the FIG. 1J structure. N-type metal layer 115 may comprise any n-type conductive material from which a metal NMOS gate electrode may be derived. N-type metal layer 115 preferably has thermal stability characteristics that render it suitable for making a metal NMOS gate electrode for a semiconductor device.

Materials that may be used to form n-type metal layer 115 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide. N-type metal layer 115 may be formed on first high-k gate dielectric layer 105 using well known PVD or CVD processes, e.g., conventional sputter or atomic layer CVD processes. As shown in FIG. 1K, n-type metal layer 115 is removed except where it fills trench 113. Layer 115 may be removed from other portions of the device via a wet or dry etch process, or an appropriate CMP operation. Dielectric 112 may serve as an etch or polish stop, when layer 115 is removed from its surface.

N-type metal layer 115 may serve as a metal NMOS gate electrode that has a workfunction that is between about 3.9 eV and about 4.2 eV, and that is between about 100 Angstroms and about 2,000 Angstroms thick and, in one embodiment, may particularly be between about 500 Angstroms and about 1,600 Angstroms thick. Although FIGS. 1J and 1K represent structures in which n-type metal layer 115 fills all of trench 113, in alternative embodiments, n-type metal layer 115 may fill only part of trench 113, with the remainder of the trench being filled with a material that may be easily polished, e.g., tungsten, aluminum, titanium, or titanium nitride. Using a higher conductivity fill metal in place of the workfunction metal may improve the overall conductivity of the gate stack. In such an alternative embodiment, n-type metal layer 115, which serves as the workfunction metal, may be between about 15 and about 1,000 Angstroms thick and, for example, between 25 and 100 Angstroms thick.

In embodiments in which trench 113 includes both a workfunction metal and a trench fill metal, the resulting metal NMOS gate electrode may be considered to comprise the combination of both the workfunction metal and the trench fill metal. If a trench fill metal is deposited on a workfunction metal, the trench fill metal may cover the entire device when deposited, forming a structure like the FIG. 1J structure. That trench fill metal must then be polished back so that it fills only the trench, generating a structure like the FIG. 1K structure.

In the illustrated embodiment, after forming n-type metal layer 115 within trench 113, sacrificial layer 106 is removed to generate trench 150 that is positioned between sidewall spacers 110, 111—producing the structure shown in FIG. 1L. In a preferred embodiment, layer 106 is exposed to a solution that comprises between about 20 and about 30 percent TMAH by volume in deionized water for a sufficient time at a sufficient temperature (e.g., between about 60° C. and about 90° C.), while applying sonic energy, to remove all of layer 106 without removing significant portions of n-type metal layer 115.

Alternatively, a dry etch process may be applied to selectively remove layer 106. When sacrificial layer 106 is doped p-type (e.g., with boron), such a dry etch process may comprise exposing sacrificial layer 106 to a plasma derived from sulfur hexafluoride ("$SF_6$") , hydrogen bromide ("HBr"), hydrogen iodide ("HI"), chlorine, argon, and/or helium. Such a selective dry etch process may take place in a parallel plate reactor or in an electron cyclotron resonance etcher.

After removing sacrificial layer 106, it may be desirable to clean second high-k gate dielectric layer 107, e.g., by exposing that layer to the hydrogen peroxide based solution described above. Optionally, as mentioned above, a capping layer (which may be oxidized after it is deposited) may be formed on second high-k gate dielectric layer 107 prior to filling trench 150 with a p-type metal. In this embodiment, however, p-type metal layer 116 is formed directly on layer 107 to fill trench 150 and to generate the FIG. 1M structure. P-type metal layer 116 may comprise any p-type conductive material from which a metal PMOS gate electrode may be derived. P-type metal layer 116 preferably has thermal stability characteristics that render it suitable for making a metal PMOS gate electrode for a semiconductor device.

Materials that may be used to form p-type metal layer 116 include: ruthenium, palladium, platinum, cobalt, nickel, and conductive metal oxides, e.g., ruthenium oxide. P-type metal layer 116 may be formed on second high-k gate dielectric layer 107 using well known PVD or CVD processes, e.g., conventional sputter or atomic layer CVD processes. As shown in FIG. 1N, p-type metal layer 116 is removed except where it fills trench 150. Layer 116 may be removed from other portions of the device via a wet or dry etch process, or an appropriate CMP operation, with dielectric 112 serving as an etch or polish stop.

P-type metal layer 116 may serve as a metal PMOS gate electrode with a workfunction that is between about 4.9 eV and about 5.2 eV, and that is between about 100 Angstroms and about 2,000 Angstroms thick, and more preferably is between about 500 Angstroms and about 1,600 Angstroms thick. Although FIGS. 1M and 1N represent structures in which p-type metal layer 116 fills all of trench 150, in alternative embodiments, p-type metal layer 116 may fill only part of trench 150. As with the metal NMOS gate electrode, the remainder of the trench may be filled with a material that may be easily polished, e.g., tungsten, aluminum, titanium, or titanium nitride. In such an alternative embodiment, p-type metal layer 116, which serves as the workfunction metal, may be between about 15 and about 1,000 Angstroms thick. Like the metal NMOS gate electrode, in embodiments in which trench 150 includes a workfunction metal and a trench fill metal, the resulting metal PMOS gate electrode may be considered to comprise the combination of both the workfunction metal and the trench fill metal.

After removing metal layer 116, except where it fills trench 150, a capping dielectric layer may be deposited onto dielectric layer 112, metal NMOS gate electrode 115, and metal PMOS gate electrode 116, using any conventional deposition process. Process steps for completing the device that follow the deposition of such a capping dielectric layer, e.g., forming the device's contacts, metal interconnect, and passivation layer, are well known to those skilled in the art and will not be described here.

Although the embodiment described above anneals high-k gate dielectric layers 105, 107 when dopants—previously implanted into sacrificial layers 104, 106 and into the source and drain regions—are activated, the high-k gate dielectric layer (or layers) may be annealed at a different stage in the process. For example, a high temperature anneal may be applied to high-k gate dielectric layer 170 immediately after that layer has been deposited on substrate 100, or such an anneal may be applied immediately after high-k gate dielectric layer 170 has been etched to form high-k gate dielectric layers 105, 107. The temperature at which such an anneal takes place should exceed about 700° C.

Forming high-k gate dielectric layers 105, 107 prior to removing sacrificial layers 104, 106 enables a high temperature anneal to be applied to those dielectric layers prior to forming silicided regions, and prior to forming metal layers on high-k gate dielectric layers 105, 107. Forming high-k gate dielectric layers 105, 107 at a relatively early stage in the process is advantageous for another reason. When an atomic layer CVD process is applied to generate high-k gate dielectric layers at the bottom of trenches 113, 150—after sacrificial layers 104, 106 are removed, the high-k dielectric material may be deposited on both the sides and bottoms of the trenches. Additional process steps may be required to prevent the high-k dielectric material's presence on the sides of the trenches from adversely affecting device characteristics—complicating the overall process. Forming high-k gate dielectric layers 105, 107 prior to removing sacrificial layers 104, 106, ensures that the high-k dielectric material will form on the trench bottoms only, and not on the sides of the trenches.

By using the implantation at the time of patterning the sacrificial layer, as shown in FIG. 1C, the implant may also breakup the high dielectric constant layer and may help with the removal of an unwanted portion of that film. If the implantation is done at this stage, the implanted hard mask film advantageously maintains sufficient integrity to block the downstream silicide process.

Figure 2:
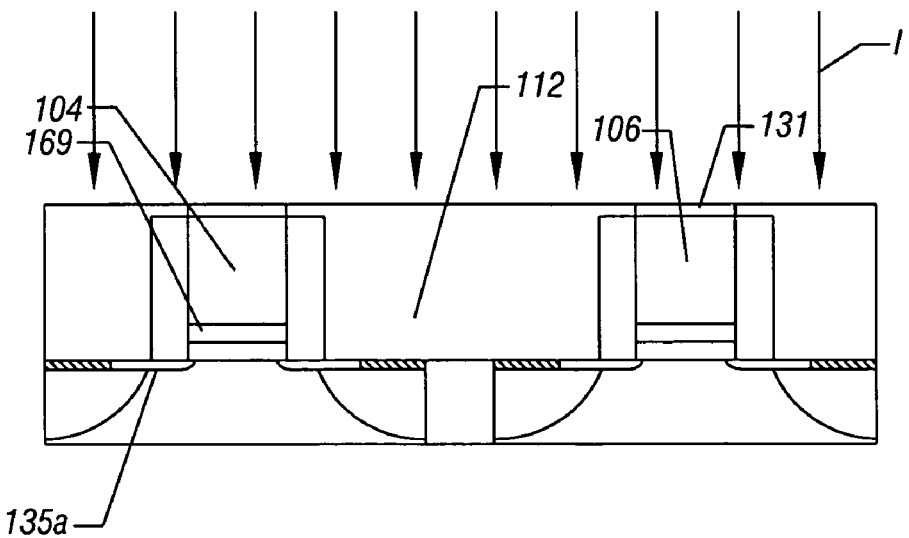
FIG. 2 is a cross-section of another embodiment of the present invention.

As another embodiment, the implantation may be implemented after polishing down the dielectric layer 112, shown in FIG. 1G, to the level of the top of the hard mask layers 131 and just prior to the removal of the hard mask layers 131, as shown in FIG. 2.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a sacrificial gate structure;
    forming a hard mask over said sacrificial gate structure;
    performing a first implant of said hard mask;
    forming silicon nitride sidewall spacers around said hard mask;
    performing a second implant to form lightly doped regions;
    removing said hard mask by planarization without removing said spacers, said spacers acting as a polish stop;
    removing said sacrificial gate structure; and
    implanting said hard mask to make said hard mask easier to polish off.

2. The method of claim 1 including replacing said sacrificial gate structure with a metal gate structure.

3. The method of claim 1 including removing a sacrificial gate structure that includes polysilicon.

4. The method of claim 1 including removing said hard mask that includes silicon nitride.

5. The method of claim 1 including implanting said hard mask using germanium.

6. The method of claim 1 including implanting said hard mask to make it more easily removable by a wet etch process.

7. The method of claim 1 including covering said hard mask, exposing said covered hard mask, and implanting said exposed covered hard mask.

8. The method of claim 7 including covering said hard mask, planarizing said covered hard mask to expose said hard mask and implanting said planarized exposed hard mask.

9. A method comprising:
    forming a sacrificial gate structure;
    forming a hard mask over said sacrificial gate structure;
    performing a first implant of said hard mask;
    forming silicon nitride sidewall spacers around said hard mask;
    performing a second implant to form lightly doped regions;
    removing said hard mask by planarization without removing said spacers, said spacers acting as a polish stop;
    removing said sacrificial gate structure; and
    implanting said hard mask to make it more easily removable by a wet etch process.

10. The method of claim 9 including replacing said sacrificial gate structure with a metal gate structure.

11. The method of claim 9 including removing a sacrificial gate structure that includes polysilicon.

12. The method of claim 9 including removing said hard mask that includes silicon nitride.

13. The method of claim 9 including implanting said hard mask using germanium.

14. The method of claim 9 including covering said hard mask, exposing said covered hard mask, and implanting said exposed covered hard mask.

15. The method of claim 9 including covering said hard mask, planarizing said covered hard mask to expose said hard mask and implanting said planarized exposed hard mask.

* * * * *